(12) United States Patent
Stolze

(10) Patent No.: US 8,087,943 B2
(45) Date of Patent: Jan. 3, 2012

(54) POWER SEMICONDUCTOR MODULE INCLUDING A CONTACT ELEMENT

(75) Inventor: Thilo Stolze, Arnsberg (DE)

(73) Assignee: Infineon Technologies AG, Neubiberg (DE)

( * ) Notice: Subject to any disclaimer, the term of this patent is extended or adjusted under 35 U.S.C. 154(b) by 391 days.

(21) Appl. No.: 12/358,987

(22) Filed: Jan. 23, 2009

(65) Prior Publication Data

US 2009/0194884 A1    Aug. 6, 2009

(30) Foreign Application Priority Data

Jan. 23, 2008  (DE) ...................... 10 2008 005 547.6

(51) Int. Cl.
*H01R 12/00*  (2006.01)
*H05K 1/00*  (2006.01)
(52) U.S. Cl. .......................................... 439/83; 439/874
(58) Field of Classification Search ................ 439/83, 439/874, 875, 876
See application file for complete search history.

(56) References Cited

U.S. PATENT DOCUMENTS

| | | | | |
|---|---|---|---|---|
| 5,517,752 A * | 5/1996 | Sakata et al. | | 29/832 |
| 5,545,589 A * | 8/1996 | Tomura et al. | | 438/119 |
| 5,816,868 A * | 10/1998 | Legrady et al. | | 439/876 |
| 6,246,587 B1 * | 6/2001 | Chen | | 361/773 |
| 6,483,128 B2 | 11/2002 | Loddenkoetter et al. | | |
| 6,623,283 B1 * | 9/2003 | Torigian et al. | | 439/83 |
| 6,979,204 B2 | 12/2005 | Goebl et al. | | |
| 7,291,914 B2 * | 11/2007 | Stolze | | 257/719 |
| 7,723,620 B2 * | 5/2010 | Kawade et al. | | 174/267 |
| 7,758,366 B2 * | 7/2010 | Masuda et al. | | 439/247 |
| 7,893,355 B2 * | 2/2011 | Oh et al. | | 174/94 R |
| 2008/0009155 A1 * | 1/2008 | Ide et al. | | 439/83 |

FOREIGN PATENT DOCUMENTS

| | | |
|---|---|---|
| DE | 10008572 A1 | 9/2001 |
| DE | 102 27 106 | 1/2004 |
| DE | 102005017849 A1 | 10/2006 |
| DE | 102005016650 A1 | 11/2006 |
| EP | 0459831 A2 | 12/1991 |
| EP | 0854548 A2 | 7/1998 |

* cited by examiner

*Primary Examiner* — Hae Moon Hyeon
(74) *Attorney, Agent, or Firm* — Dicke, Billig & Czaja, PLLC

(57) ABSTRACT

A power semiconductor module including a contact element. One embodiment provides an electrically conductive contact element extending in a longitudinal direction and having a first end and a second end lying opposite the first end. The contact element has a first flange at its first end. The first flange is embodied such that when the contact element is placed with the first flange ahead onto a plane perpendicular to the longitudinal direction, the first flange has with the plane a number of first contact areas spaced apart from one another.

24 Claims, 6 Drawing Sheets

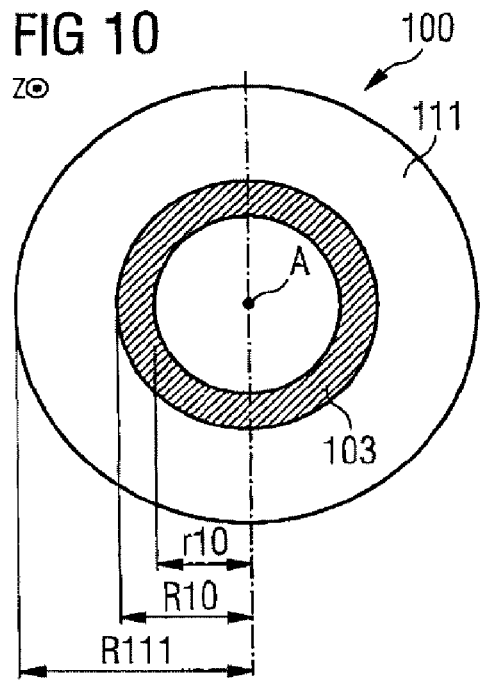
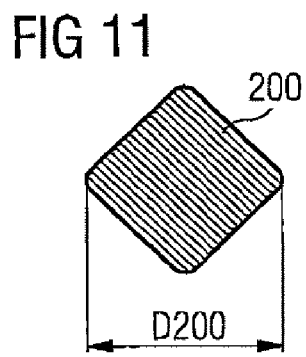
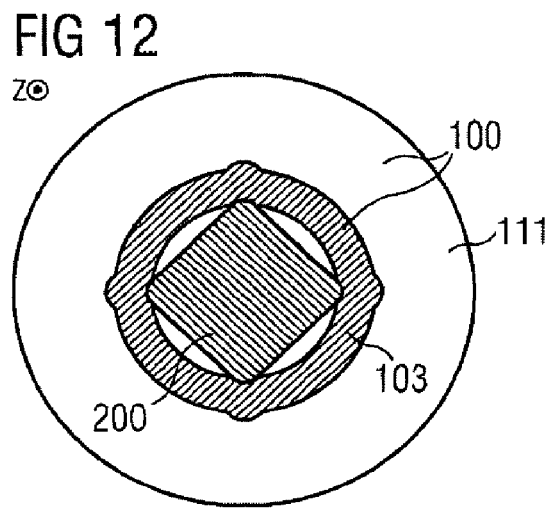

POWER SEMICONDUCTOR MODULE INCLUDING A CONTACT ELEMENT

CROSS-REFERENCE TO RELATED APPLICATIONS

This Utility Patent Application claims priority to German Patent Application No. DE 10 2008 005 547.6-33 filed on Jan. 23, 2008, which is incorporated herein by reference.

BACKGROUND

The invention relates to a contact element, in one embodiment to a contact element for use in a power semiconductor module.

Power semiconductor modules have a metalized circuit carrier that has to be electrically conductively connected to further components, for example, to a driving unit, or to a flat conductor such as e.g., a stripline. The connection technology used for this purpose is intended to be simple and inexpensive to produce and, moreover, to have a sufficient long-term stability in the context of mechanical stresses and vibrations that occur. For this purpose, the connection technology can have contact elements that are soldered onto a metallization of the circuit carrier.

There is general need to provide a contact element which fulfills the abovementioned properties and which enables reliable and simple soldering. A further general need is to provide a power semiconductor module and also a circuit arrangement having a power semiconductor module which can be electrically contact-connected in a simple manner by using a contact element.

For these and other reasons, there is a need for the present invention.

BRIEF DESCRIPTION OF THE DRAWINGS

The accompanying drawings are included to provide a further understanding of embodiments and are incorporated in and constitute a part of this specification. The drawings illustrate embodiments and together with the description serve to explain principles of embodiments. Other embodiments and many of the intended advantages of embodiments will be readily appreciated as they become better understood by reference to the following detailed description. The elements of the drawings are not necessarily to scale relative to each other. Like reference numerals designate corresponding similar parts.

FIG. 10 illustrates a horizontal section through the contact element in accordance with FIG. 4 in a plane E4 perpendicular to the longitudinal direction.

FIG. 11 illustrates a horizontal section through a contact pin.

FIG. 12 illustrates a horizontal section through the contact element in accordance with FIG. 4 corresponding to the horizontal section in accordance with FIG. 10, wherein the contact pin having an oversized dimensioning is pushed into the contact element.

DETAILED DESCRIPTION

In the following Detailed Description, reference is made to the accompanying drawings, which form a part hereof, and in which is shown by way of illustration specific embodiments in which the invention may be practiced. In this regard, directional terminology, such as "top," "bottom," "front," "back," "leading," "trailing," etc., is used with reference to the orientation of the Figure(s) being described. Because components of embodiments can be positioned in a number of different orientations, the directional terminology is used for purposes of illustration and is in no way limiting. It is to be understood that other embodiments may be utilized and structural or logical changes may be made without departing from the scope of the present invention. The following detailed description, therefore, is not to be taken in a limiting sense, and the scope of the present invention is defined by the appended claims.

It is to be understood that the features of the various exemplary embodiments described herein may be combined with each other, unless specifically noted otherwise.

Unless indicated otherwise, identical reference symbols designate identical elements with an identical function.

Figure 1:
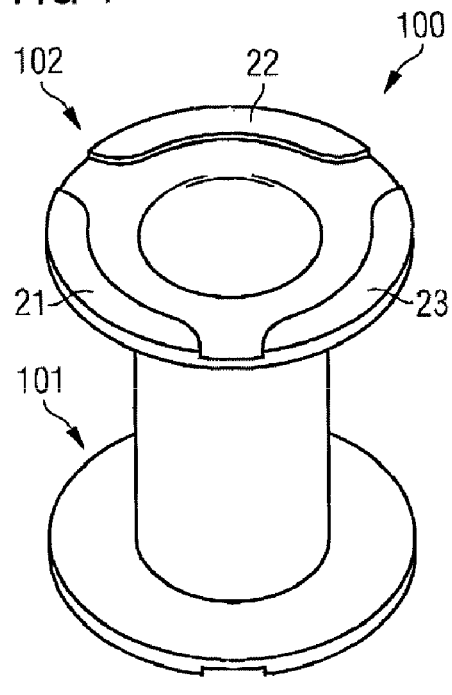
FIG. 1 illustrates one embodiment of a tubular contact element which extends in a longitudinal direction running in a vertical direction z and which has at its two ends lying opposite one another in each case a flange provided with webs.
Figure 2:
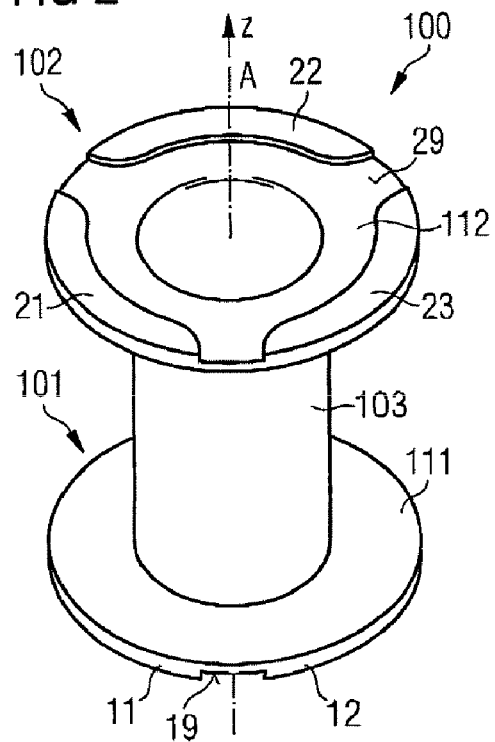
FIG. 2 illustrates a graphical illustration of the contact element in accordance with FIG. 1 in perspective view.

One or more embodiments provide a power semiconductor module and circuit arrangement including a contact element. In one embodiment, a contact element is provided that extends in a longitudinal direction and has a first end and a second end arranged opposite the first end. A first flange is provided at the first end, the first flange being embodied such that when the contact element is placed with the first flange ahead onto a plane perpendicular to the longitudinal direction, the first flange has with the plane a number $N1 \geq 2$ of first contact areas spaced apart from one another. Since the first flange therefore does not lie on the plane over the whole area, free regions remain between the first flange and the plane. If the plane is formed, for example, by a conductor area onto which the contact element is intended to be soldered, the solder, which is liquid during soldering, can penetrate between the first flange and the conductor area and thus bring about a secure, fixed and permanent connection FIG. 1 and FIG. 2 illustrate one embodiment of a contact element 100. In one embodiment, contact element 100 is suitable fur use in a power semiconductor. The contact element 100 includes a shaft 103 embodied as a cylindrical tube and having a cylinder axis A. The contact element 100 has a first flange 111 at a first end 101. Moreover, an optional second flange 112 is provided at its second end 102 lying opposite the first end 101. On its side remote from the second end 102, the first flange 111 has three webs spaced apart from one another, of which only the first and the second web 11 and 12, respectively, can be discerned in FIG. 2, while the third web is concealed. Moreover, the first flange 111 has on its side remote from the second end an optional planar surface section 19 which is perpendicular to the longitudinal direction and beyond which the webs 11, 12 extend.

In one embodiment, the second flange 112 can have on its side remote from the first end 101 an optional planar surface section 29 beyond which extend webs 21, 22, 23 of the second flange 112 which are spaced apart from one another.

Figure 3:
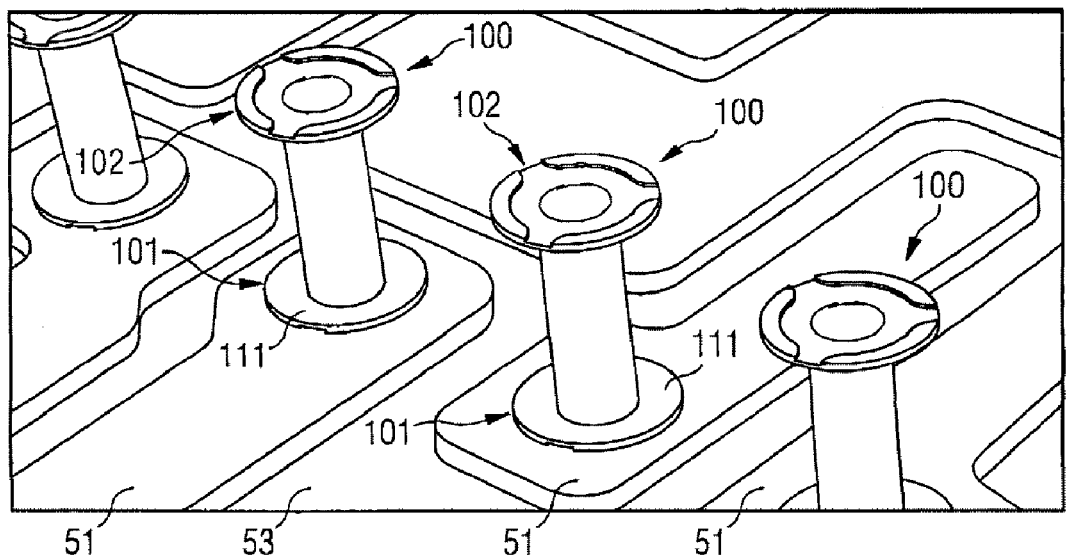
FIG. 3 illustrates one embodiment of a section of a circuit carrier which has a number of metallization sections spaced apart from one another, wherein a respective contact element in accordance with FIGS. 1 and 2 is soldered onto some metallization sections.

FIG. 3 illustrates a circuit carrier having an insulating carrier 53, to which are applied conductor areas 51 spaced apart from one another. A respective contact element in accordance with FIGS. 1 and 2 is soldered onto some of these contact areas 51 with its first flange 111 and thus with its first end 101 ahead. At its second end 102 lying opposite the first end 101 in the longitudinal direction, the contact element 100 has an optional second flange 112, which can be embodied identically to the first flange 111, for example. It can be discerned in FIG. 3 that the upper ends 102 can each have a funnel-shaped section that facilitates the insertion of a contact pin into the relevant contact element 100.

Figure 4:
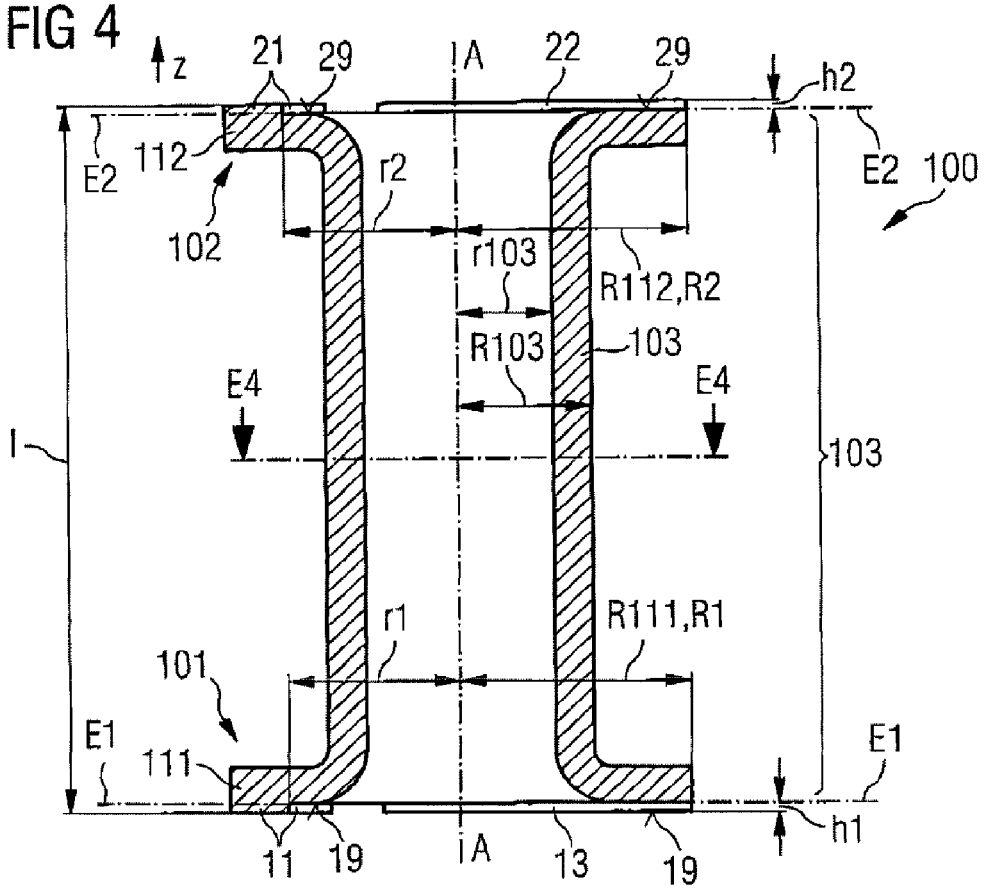
FIG. 4 illustrates a vertical section through the contact element in accordance with FIGS. 1 and 2.

FIG. 4 illustrates a vertical section through the contact element in accordance with FIG. 2. The respectively optional planar surface sections 19 of the first flange 111 and 29 of the second flange 112 can clearly be discerned in this view. The planar surface section 19 is arranged in a plane E1 perpendicular to the longitudinal direction z. The planar surface section 29 is correspondingly arranged in a plane E2 perpendicular to the longitudinal direction z. The webs 11, 12 of the first flange 111 extend beyond the first planar surface section 19 by a height h1. The webs 21, 22 of the second flange 112 correspondingly extend beyond the second planar surface section 29 by a height h2. The heights h1 and/or h2 can be, independently of one another, in each case less than 1 mm, for example, 10 µm to 200 µm. The contact element 100 overall extends over a length 1 in the longitudinal direction z of the shaft 103. The length l can be chosen freely, in principle, and can be, for example, 2 mm to 4 mm.

Furthermore, FIG. 4 additionally reveals the outer radius R103 and the inner radius r103 of the shaft 103 and also the radii R111 of the first flange 111 and R112 of the second flange 112. As is explained in more detail below in FIG. 5, the webs 11, 12, 13 of the first flange 111 can form a segmented ring having an outer radius R1 and an inner radius r1. The webs 21, 22, 23 of the second flange 112 can also correspondingly form a segmented ring having an outer radius R2 and an inner radius r2. These outer radii R1, R2 and inner radii r1, r2 are likewise depicted in FIG. 4. The outer radii R1 and/or R2 can e.g., each lie within the range of 0.5 mm to 2 mm and be chosen independently of one another, but also identically. The outer radius R103 of the shaft 103 can be 1 mm to 2 mm, for example, and its inner radius r103 can be 0.5 mm to 1 mm, for example.

Figure 5:
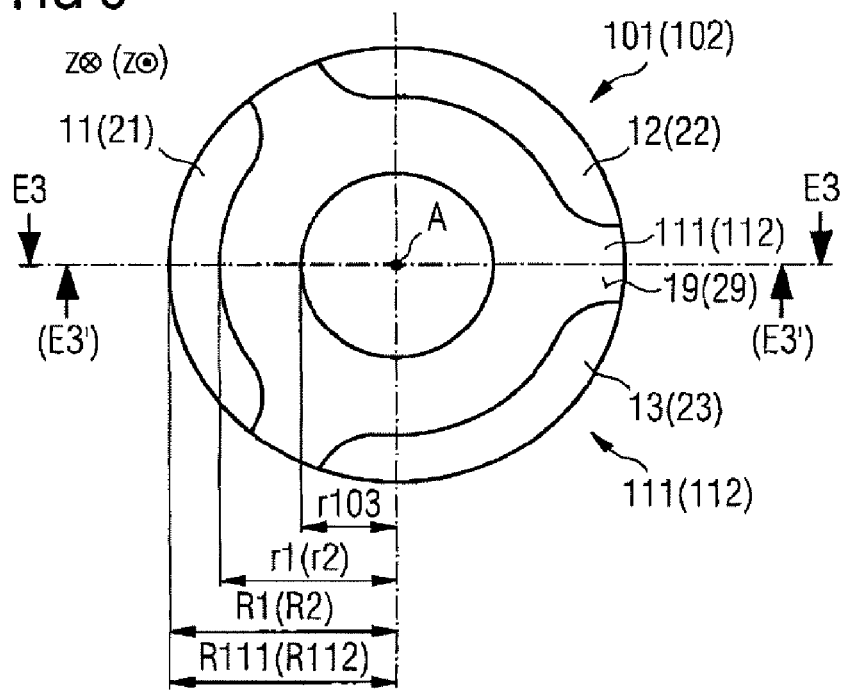
FIG. 5 illustrates a plan view of the contact element in accordance with FIGS. 1 and 2 counter to the vertical direction z.

FIG. 5 illustrates a plan view of the first flange 111 of the contact element 100 in accordance with FIG. 4 in the vertical direction z. This view reveals that the webs 11, 12, 13 are arranged in a manner spaced apart from one another and along the circumference of the first flange 111. The first webs 11, 12, 13 form a segmented ring having an outer radius R1 and an inner radius r1. As in the exemplary embodiment in accordance with FIG. 5, the outer radius R1 can be chosen to be equal in magnitude to the outer radius R111 of the first flange 111. In one embodiment, the outer radius R1 of the segmented ring can also be chosen to be smaller than the outer radius R111 of the first flange 111.

As can furthermore be gathered from FIG. 5, the inner radius r1 of the segmented ring can be chosen to be larger than the inner radius r103 of the shaft 103. As an alternative to this, the inner radius r1 of the segmented ring and the inner radius r103 of the shaft 103 can also be chosen to be identical.

The second end of the contact element 101 illustrated in FIG. 4 can be embodied in just the same way as the first end 101 of the contact element. By way of example, the first end 101 and the second end 102 can be embodied mirror-symmetrically with respect to a plane E4 perpendicular to the longitudinal direction z. However, such mirror symmetry is not mandatory; by way of example, the ends 101 and 102 with their flanges 111 and 112, respectively, can be constructed identically yet be rotated relative to one another.

For the mirror-symmetrical contact element 100 illustrated in FIG. 4, FIG. 5 corresponds to the view of the contact element 100 counter to the vertical direction z. The indications and reference symbols applicable to this view have been placed between parentheses.

Figure 6:
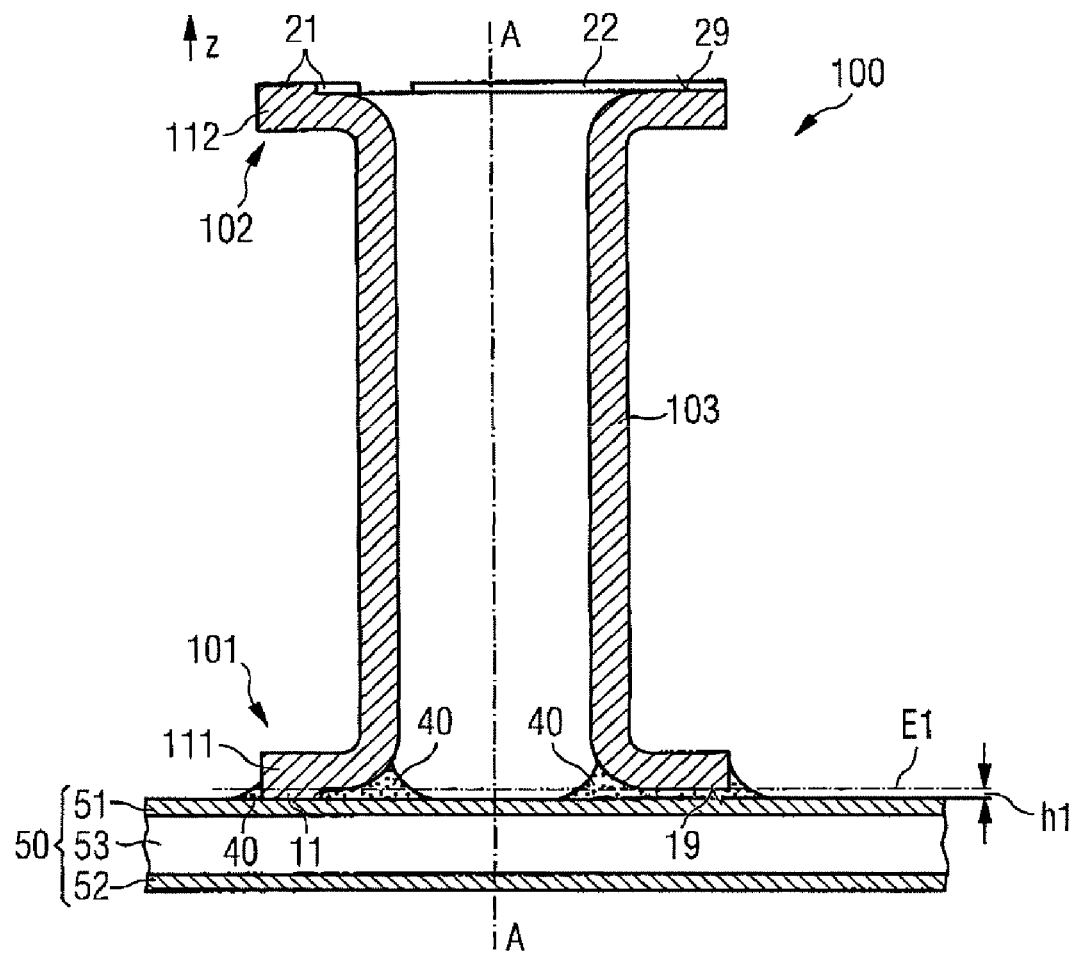
FIG. 6 illustrates a vertical section through an arrangement wherein the contact element in accordance with FIG. 4 is soldered with a flange ahead onto a metallization of a circuit carrier, wherein the flange has webs that make contact directly with the metallization.

FIG. 6 illustrates the contact element 100 in accordance with FIG. 4, soldered onto a metallization 51 of a circuit carrier 50. The metallization 51 is embodied in planar fashion altogether or at least in the section in which the contact element 100 is soldered on. In this case, the longitudinal axis A ideally runs perpendicular to the planar metallization 51 or to the planar section thereof. Since the contact element 100 lies on the metallization 51 and thus makes contact with the latter, the solder 40 used has, at least in the region of the planar surface section 19, the thickness h1 corresponding to the height by which the webs 11 and also the webs 12, 13—which can be seen from FIG. 5—of the first flange 111 project beyond the plane E1 of the planar sections 19.

Figure 7:
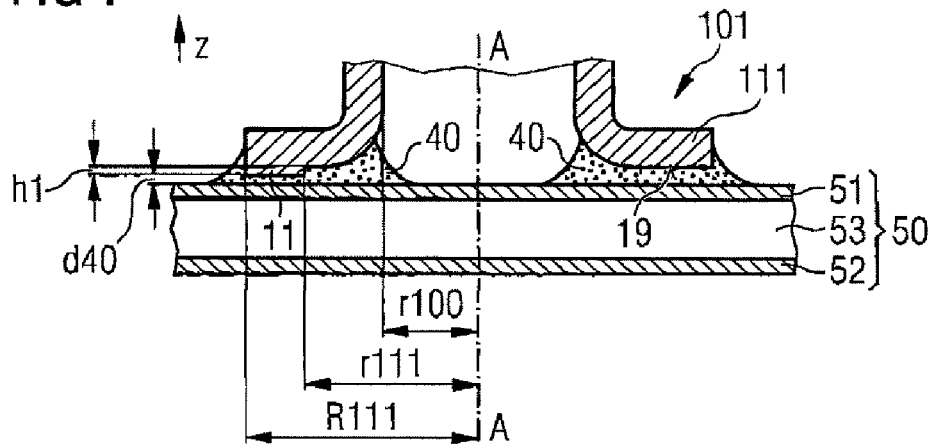
FIG. 7 illustrates a view corresponding to the arrangement in accordance with FIG. 6, with the difference that a solder layer is arranged between the webs and the metallization.

In a departure from the illustration of FIG. 6, the contact element 100 need not make contact directly with the metallization 51. As is illustrated in FIG. 7, it is possible, by way of example, for a section of the solder 40 having the thickness d40 also to remain between the webs 11 of the first flange 111 and the metallization 51. The thickness d40 can be e.g., from greater than 0 mm to 100 mm. An arrangement in accordance with FIG. 7 can result, for example, from the soldering connection between the contact element 100 and the metallization 51 being produced by a solder 40 in the form of a solder paste firstly being applied to the metallization 51. The contact element 100 is placed onto the solder paste. Afterward, the solder paste is melted and then cooled to below its melting point. Because of the wetting behavior of the liquid solder 40 during the melting phase, the solder 40 assumes a form as illustrated in FIG. 7. The partial layer of the solder 40 having the thickness d40 in this case remains between the web 11 of the first flange 111 and the metallization 51.

Figure 8:
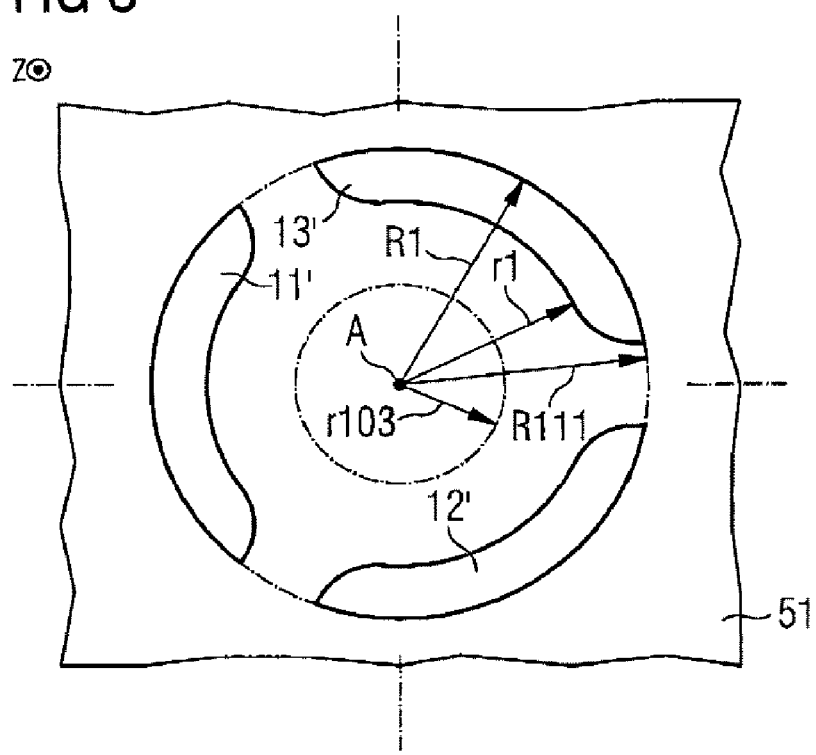
FIG. 8 illustrates the contact areas which the contact element in accordance with FIG. 4 has with a plane which is perpendicular to the longitudinal direction and onto which the contact element is placed with a flange, wherein the contact areas form a segmented ring.

FIG. 8 illustrates contact areas 11', 12', 13' which the contact element 100 in accordance with FIG. 4 has when it is placed with the first flange 111 ahead onto a planar area, for example, the metallization 51, with this plane. The contact areas 11', 12' and 13' correspond—in the stated order—to the webs 11, 12, 13 of the first flange 111.

Because of the—in vertical section—rectangular configuration of the webs of the first flange 111 as can be seen from FIG. 4 on the basis of the example of the web 11, the contours of the contact areas 11', 12', 13' are identical to the contours of the webs 11, 12, 13 as revealed by the view in accordance with FIG. 5. However, the webs 11, 12, 13 need not necessarily have rectangular vertical sections. By way of example, the web 11 in accordance with FIG. 4, in the cross-sectional view illustrated therein, could taper conically from a side facing the second end 112 to its side remote from the second end 102. In this case, the contact areas 11', 12', 13' illustrated in FIG. 8 would be narrower in a radial direction than illustrated.

Figure 9:
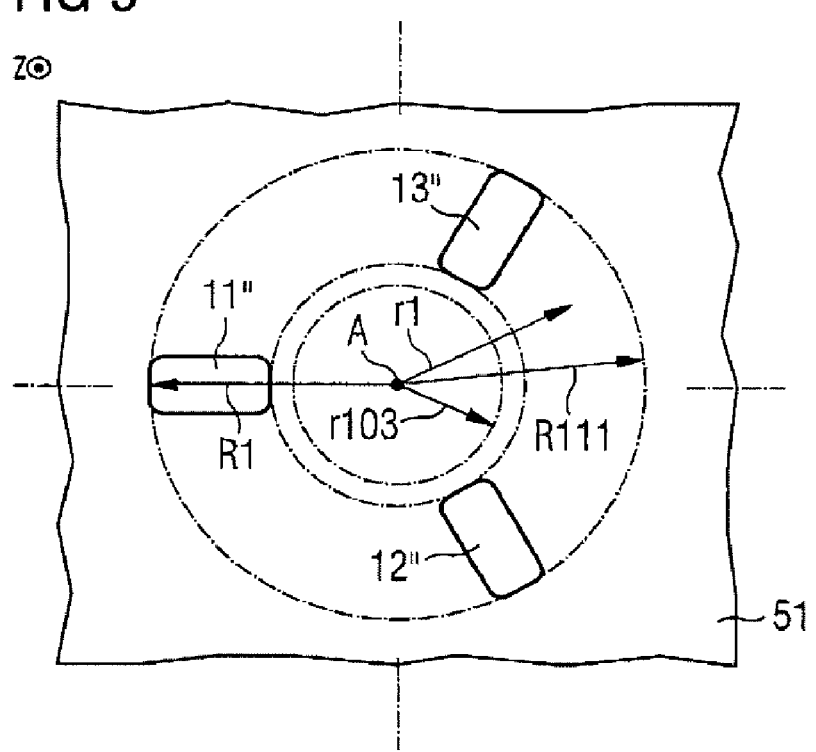
FIG. 9 illustrates an arrangement corresponding to FIG. 8, wherein the contact areas are arranged in spoke-like fashion with respect to one another.

The first webs 11, 12, 13 of the contact element 100 in accordance with FIGS. 4 and 5 form a segmented ring, as explained. In one embodiment, the webs 11, 12, 13 spaced apart from one another can run radially with respect to one another, thus resulting in contact areas 11", 12", 13" as illustrated by way of example in FIG. 9.

FIG. 10 illustrates a cross-sectional view through the contact element 100 in accordance with FIG. 4 in a plane E4 perpendicular to the longitudinal direction z. The cylindrical-ring-shaped structure of the shaft 103 can clearly be discerned in this view. The shaft 103 has an inner diameter corresponding to double the inner radius r103. In order to make contact with the metallization 51 in FIGS. 6 and 7 with the aid of the contact element 100, provision is made for inserting a contact pin into the shaft 103 of the contact element 100, which contact pin is electrically conductively connected or can be electrically conductively connected to other electrical components.

FIG. 11 illustrates a cross section through an exemplary embodiment of a contact pin 200 suitable for this purpose. The contact pin 200 has a substantially square cross section, apart from rounded corners. In the sectional plane illustrated, the contact pin 200 has a maximum dimension D200 in the cross-sectional plane. The maximum dimension D200 is chosen to be greater than double the inner radius R103 of the shaft 103 of the contact element in accordance with FIGS. 6, 7 and 10. As a result of this, a fixed electrically conductive connection between the contact element 100 and the contact pin 200 arises when the contact pin 200 in accordance with FIG. 11 is inserted into the contact element 100 in accordance with FIGS. 6, 7 and 10, wherein the shaft 103 is slightly deformed during the insertion of the contact pin 200 because of the oversize dimensioning thereof, which is explained by way of example with reference to FIG. 12 in a cross-sectional view corresponding to the cross-sectional views in accordance with FIGS. 10 and 11.

Figure 13:
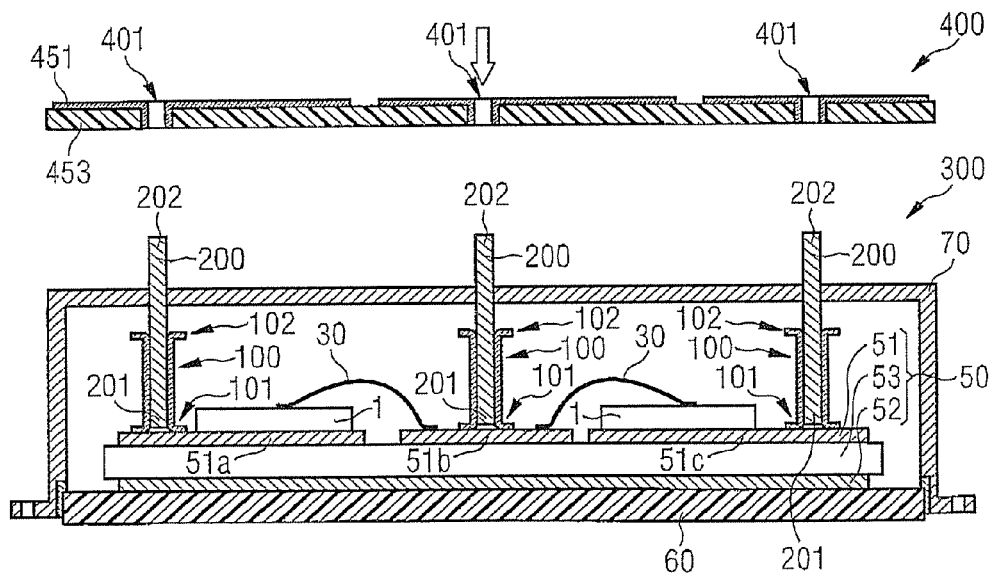
FIG. 13 illustrates a power semiconductor module having a circuit carrier provided with contact elements in accordance with FIG. 6, wherein contact pins are inserted into the contact elements and project from a housing of the power semiconductor module in order to enable the latter to be electrically connected to a printed circuit board.

FIG. 13 illustrates a power semiconductor module 300 having a circuit carrier 50, which has, inter alia, a structured metallization 51 having planar sections 51a, 51b and 51c spaced apart from one another. A respective contact element 100, which can be embodied, for example, in accordance with one of the contact elements 100 explained above, is soldered on one of the planar sections of the metallization 51, as explained with reference to FIGS. 6 and 7. In this power semiconductor module, the circuit carrier 50 is embodied as a ceramic substrate 53 provided with metallizations 51, 52 on mutually opposite sides. The ceramic 53 used can be aluminum oxide or aluminum nitride, for example. Copper or a copper alloy, for example, can be chosen as material for the metallizations 51, 52. A respective power semiconductor chip 1 is applied to the metallization sections 51a and 51c and electrically conductively connected to the metallization section 51b by bonding wires 30.

In order to electrically connect the metallization sections 51a, 51b, 51c to any other electronic component desired in principle, a contact pin 200 is inserted into each of the contact elements 100. The upper ends 202 of the contact pins 200 can be connected to the other component or can already represent a constituent part thereof.

The other electronic component can be arranged within or outside the housing 70. For the connection of an external electronic component arranged outside the housing 70, the upper ends 202 of the contact pins 200 are led through openings in the housing 70 and project from the latter.

In order to electrically conductively connect the power semiconductor module 300 to a further component, the component can be provided with openings which are arranged in the component in a manner corresponding to the arrangement of the contact pins 200 with respect to one another.

In FIG. 13, a printed circuit board 400 arranged outside the housing 70 is provided as a further component. The printed circuit board 400 has a structured metallization 451, and also plated-through holes 401 by which the printed circuit board 400 is plugged onto the ends 202 of the contact pins 200, such that the ends 202 at least dip into the plated-through holes 401 and optionally project through the plated-through holes 401.

Figure 14:
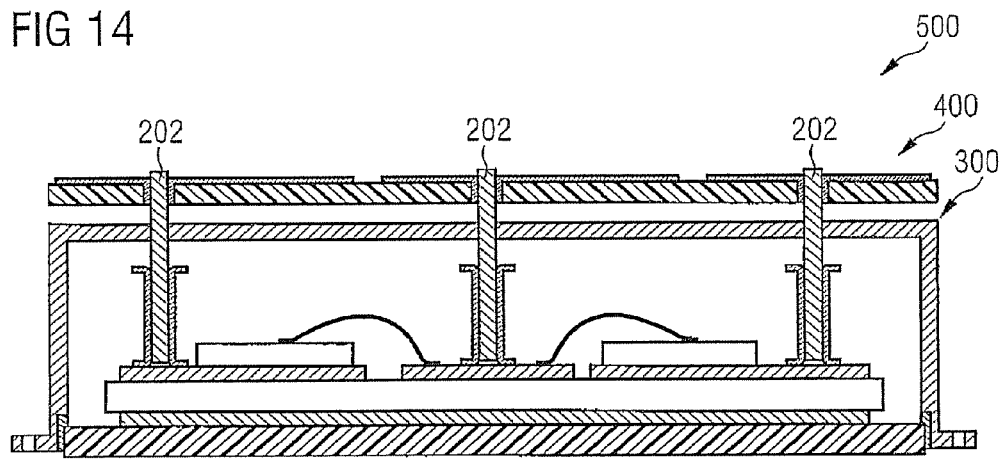
FIG. 14 illustrates the power semiconductor module in accordance with FIG. 13 with the printed circuit board then placed.

In order to produce a fixed and permanent connection between the contact pins 200 and the plated-through holes 401 and also the metallization sections of the metallization 451 that are respectively connected thereto, the connection can be configured as a press-fit connection ("press-fit contact") if the upper end 202 of the relevant contact pin has an oversize dimensioning relative to the corresponding opening 401. As an alternative to a press-fit connection, however, a contact pin 200 introduced into an opening 401 can also be soldered to the corresponding section of the metallization 451 of the printed circuit board 400. FIG. 14 illustrates the circuit arrangement produced by placing the printed circuit board 400 onto the power semiconductor module 300.

Instead of a press-fit connection, in the case of one or a plurality of the contact pins 200, the upper end 202 can be configured in spring-like fashion in order to enable a secure and permanent electrical contact with an external component. The upper end of such a contact pin can likewise have a screw-on eye, a screw terminal or a thread.

Various exemplary embodiments have been explained above in order to illustrate the concept of the invention. However, the invention is also directed to configurations other than those explained. Thus, by way of example, instead of the three webs 11, 12, 13 or 21, 22, 23 of a flange 111 or 112, respectively, that are spaced apart from one another as illustrated, it is also possible for two, four or more webs to be provided. Moreover, the form of the shaft 103 need not necessarily be embodied in cylindrical-ring-shaped fashion. Other forms are likewise conceivable as long as it remains ensured that a secure and permanent electrically conductive connection is produced by inserting a contact pin into the shaft 103 of the contact element 100. By way of example, it may suffice if the shaft 103 is embodied in cylindrical-ring-shaped fashion only in sections, and/or if it has a narrowing into which a contact pin having a suitable cross section can be press-fitted.

In addition, a contact element 100 need not necessarily be constructed symmetrically. However, in one embodiment the ends 101, 102 arranged on mutually opposite sides of the shaft 103 respectively have a flange 111 and 112 provided with webs, since then the contact elements can be placed, by using a pick-and-place method, together with semiconductor chips and/or other components onto a circuit carrier provided with a soldering paste and can be soldered to the circuit carrier in a common melting process of the soldering paste without having to give consideration, during the placement process, to whether the contact element 100 is correctly oriented or "it is upside down".

Instead of the printed circuit board 400 illustrated in FIGS. 13 and 14, other external components can also be pressed and/or soldered onto the ends 202 of the contact pins 200 which project from the power semiconductor module 300. Such other components can be, for example, flat strip conductors, for example, striplines. It is likewise possible, of course, to connect different contact pins 200 or contact pin groups of the power semiconductor module 300 to different external components in this way.

As can be seen from the above, since the first flange does not lie on the plane over the whole area, free regions remain between the first flange and the plane. If the plane is formed, for example, by a conductor area onto which the contact element is intended to be soldered, the solder, which is liquid during soldering, can penetrate between the first flange and the conductor area and thus bring about a secure, fixed and permanent connection A contact element can be realized, for example, by providing the flange with two, three or more webs. By way of the height and/or the form of the webs, a defined distance between the contact element and the conductor area can be established at least at some locations of the soldering connection to be produced.

The conductor area can be, for example, the metallization of a circuit carrier of a power semiconductor module. The contact element can be embodied in tubular fashion, for example, such that an electrically conductive contact pin can be inserted into the soldered-on contact element. That part of the contact pin which projects from the contact element can be used for electrically conductively connecting the power semiconductor module to an external component, for example, a driving circuit board or a flat conductor.

Although specific embodiments have been illustrated and described herein, it will be appreciated by those of ordinary skill in the art that a variety of alternate and/or equivalent implementations may be substituted for the specific embodiments shown and described without departing from the scope of the present invention. This application is intended to cover any adaptations or variations of the specific embodiments discussed herein. Therefore, it is intended that this invention be limited only by the claims and the equivalents thereof.

What is claimed is:

1. A power semiconductor module comprising:
a circuit carrier having at least one planar conductor area and at least one longitudinally extending contact element comprising a first end and a second end arranged opposite the first end, the first end including a first flange having two or more contact areas spaced apart from one another and configured such that when the contact element is placed onto the planar conductor area perpendicular to the longitudinal direction, the two or more contact areas are disposed along the planar conductor area,
wherein each contact element is soldered with the first flange onto one of the planar conductor areas such that the longitudinal direction of the contact element runs perpendicular to the planar conductor area,
wherein the second end includes a second flange having two or more contact areas spaced apart from one another configured such that when the contact element is placed onto the planar conductor area perpendicular to the longitudinal direction, the at least two second contact areas are disposed parallel to the planar conductor area, and
wherein the contact element has an opening for receiving a contact pin via the second end.

2. The power semiconductor of claim 1, comprising wherein the first flange has two or more webs spaced apart from one another corresponding to the two or more contact areas.

3. The power semiconductor of claim 2, comprising wherein a first web and the first flange are embodied in one piece.

4. The power semiconductor module of claim 1, comprising wherein a solder is arranged between the first flange and the planar conductor area.

5. The power semiconductor module of claim 1, comprising wherein an electrically conductive contact pin is provided for each contact element, the contact pin being inserted into the opening of an associated contact element.

6. The power semiconductor module of claim 5, further comprising:
a housing, wherein the circuit carrier and the at least one contact element are arranged within the housing, and wherein each of the contact pins has an end projecting from the housing.

7. A device comprising:
an electrically conductive contact element extending in a longitudinal direction,
the contact element including a first end and a second end arranged opposite the first end the first end having a first flange including at least two first contact areas spaced apart from one another configured such that when the contact element is placed with the first flange onto a plane perpendicular to the longitudinal direction, the first contact areas are disposed along the plane,
wherein the second end includes a second flange having two or more contact areas spaced apart from one another configured such that when the contact element is placed onto the planar conductor area perpendicular to the longitudinal direction, the at least two second contact areas are disposed parallel to the planar conductor area, and
wherein the contact element has an opening for receiving a contact pin via the second end.

8. The device of claim 7, comprising wherein the first flange at least two first webs spaced apart from one another corresponding to the two or more contact areas.

9. The device of claim 8, comprising wherein the first webs and the first flange are embodied in one piece.

10. The device of claim 8, comprising wherein the first flange has on a side remote from the second end a planar first surface section perpendicular to the longitudinal direction, the first webs being arranged on the first surface section.

11. The device of claim 8, comprising wherein two, three or more of the first webs form a segmented first ring.

12. The device of claim 11, comprising wherein the segmented first ring and the first flange have the same outer radius.

13. The device of claim 11, comprising wherein the segmented first ring has an outer radius of 0.5 mm to 2 mm.

14. The device of claim 11, comprising wherein the first webs are arranged in spoke-like fashion with respect to one another to form the segmented first ring.

15. The device of claim 11, the contact element embodied between the first end and the second end is a tube having an inner radius that is less than the inner radius of the segmented first ring.

16. The device of claim 15, comprising wherein the tube is embodied in cylindrical-ring-shaped fashion and has an inner radius of 0.5 mm to 1 mm.

17. The device of claim 15, comprising wherein the tube is embodied in cylindrical-ring-shaped fashion and has an outer radius of 1 mm to 2 mm.

18. The device of claim 7, comprising wherein the second flange has at least two second webs spaced apart from one another corresponding to the contact areas.

19. The device of claim 18, comprising wherein the second webs and the second flange are embodied in one piece.

20. The device of claim 18, comprising wherein the second webs are arranged in spoke-like fashion with respect to one another to form the segmented second ring.

21. A power semiconductor module comprising:
a circuit carrier having at least one planar conductor area and at least one contact element comprising a first end and a second end arranged opposite the first end, wherein the contact element has a first flange at the first end, the first flange having at least two first contact areas spaced apart from one another being configured such that when the contact element is placed with the first flange onto a plane perpendicular to the longitudinal direction, the first contact areas are disposed along the at least one planar conductor area, wherein each of the contact elements is soldered with the first flange ahead onto one of the planar conductor areas such that the longitudinal direction of the contact element runs perpendicular to the relevant planar conductor area,
wherein the second end includes a second flange having two or more contact areas spaced apart from one another configured such that when the contact element is placed onto the planar conductor area perpendicular to the longitudinal direction, the at least two second contact areas are disposed parallel to the planar conductor area, and
wherein the contact element has an opening for receiving a contact pin via the second end.

22. The power semiconductor module of claim 21, comprising wherein a solder is arranged between the first flange and the planar conductor area.

23. The power semiconductor module of claim 21, comprising wherein an electrically conductive contact pin is provided for each of the contact elements, the contact pin being inserted into the opening of an associated contact element.

24. A circuit arrangement comprising:
a circuit carrier having at least one planar conductor area and at least one longitudinally extending contact element comprising a first end and a second end arranged opposite the first end, the first end including a first flange having two or more contact areas spaced apart from one another configured such that when the contact element is placed onto the planar conductor area perpendicular to the longitudinal direction two or more contact areas are disposed along the planar conductor area;
wherein each of the contact elements is soldered with the first flange ahead onto one of the planar conductor areas such that the longitudinal direction of the contact element runs perpendicular to the relevant planar conductor area,
wherein the second end includes a second flange having two or more contact areas spaced apart from one another configured such that when the contact element is placed onto the planar conductor area perpendicular to the longitudinal direction, the at least two second contact areas are disposed parallel to the planar conductor area, and
wherein the contact element has an opening for receiving a contact pin via the second end; and
a printed circuit board is press-fit or soldered to an end of the contact pin projecting from the contact element.

* * * * *